US005736452A

United States Patent [19]
Dekker et al.

[11] Patent Number: 5,736,452
[45] Date of Patent: Apr. 7, 1998

[54] METHOD OF MANUFACTURING A HYBRID INTEGRATED CIRCUIT

[75] Inventors: Ronald Dekker; Henricus G. R. Maas; Wilhelmus T. A. J. Van Den Einden; Maria H. W. A. Van Deurzen, all of Eindhoven, Netherlands

[73] Assignee: U.S. Philips Corporation, New York, N.Y.

[21] Appl. No.: 815,245

[22] Filed: Mar. 12, 1997

[30] Foreign Application Priority Data

Mar. 12, 1996 [EP] European Pat. Off. ............. 96200674

[51] Int. Cl.⁶ .................................................. H01L 21/306
[52] U.S. Cl. ........................................ 438/455; 438/238
[58] Field of Search .............................. 438/406, 455, 438/459, 238, 381, 458

[56] References Cited

U.S. PATENT DOCUMENTS

| 4,017,341 | 4/1977 | Suzuki et al. | 438/406 |
| 5,356,827 | 10/1994 | Ohoka | 438/459 |
| 5,446,309 | 8/1995 | Adachi et al. | 257/528 |
| 5,476,809 | 12/1995 | Kobayashi | 438/406 |

*Primary Examiner*—Jey Tsai
*Attorney, Agent, or Firm*—Steven R. Biren

[57] ABSTRACT

A method of manufacturing a semiconductor device with a substrate (1) provided with a passive element (2), a pattern of conductors (3, 4), and a semiconductor element (5) which is formed in a small slice (6) of semiconductor material. The passive element (2), the pattern of conductors (3, 4), and the semiconductor element (5) are formed at a first side (8) of a wafer of semiconductor material (7), whereupon this wafer is glued with its first side (8) to the substrate (1), and the semiconductor material of the wafer (7) is removed from the second side (22) thereof, except at the area of the semiconductor element (5). A small slice (6) of semiconductor material thus remains in which the semiconductor element (5) has been formed. The wiring may be realized in a simple manner without the introduction of additional and expensive process steps, while the introduction of parasitic capacitances and self-inductances is counteracted.

6 Claims, 1 Drawing Sheet 5,736,452

METHOD OF MANUFACTURING A HYBRID INTEGRATED CIRCUIT

BACKGROUND OF THE INVENTION

The invention relates to a method of manufacturing a semiconductor device with a substrate provided with a passive element, a pattern of conductors, and a semiconductor element which is formed in a small slice of semiconductor material.

The semiconductor element may be a single diode or transistor, but in practice it is usually an integrated circuit comprising a very large number of transistors. A number of small slices of semiconductor material provided with semiconductor elements and a number of passive elements such as resistors, capacitors, and coils may be provided on the substrate. The semiconductor elements and passive elements are interconnected by means of conductors present on the substrate. A hybrid integrated circuit is thus formed on the substrate. Since the substrate can be of an insulating or semi-insulating material, parasitic capacitances and self-inductances are avoided, so that signals of very high frequencies can be processed in such hybrid integrated circuits.

U.S. Pat. No. 5,446,309 discloses a method of the kind mentioned in the opening paragraph whereby passive elements, capacitors and coils in this case, and a pattern of conductors are formed on a substrate, whereupon a small slice of semiconductor material provided with a semiconductor element is fastened to the substrate. The slice is directly connected with its lower side to one of the conductors on the substrate here. Further electrical connections are achieved by means of metal wires which are connected at one end to the semiconductor element and at another end to the conductors present on the substrate.

Wiring of such hybrid integrated circuits is intricate and thus expensive. In addition, parasitic capacitances and self-inductances are introduced. The slice with the semiconductor element is fastened with its lower side to a conductor present on the substrate. Since this connection must be well-conducting, high requirements are to be imposed on the fastening method. The provision of said further electrical connections between the semiconductor element and the conductors present on the substrate by means of metal wires is also expensive. Special, very costly equipment is required for providing these metal connection wires. In addition, the metal wires which are arranged in loops introduce parasitic capacitances and self-inductances.

SUMMARY OF THE INVENTION

The invention has for its object inter alia to provide a method of manufacturing a hybrid integrated circuit whereby the wiring is achieved in a simple manner without the introduction of additional and expensive process steps and whereby the introduction of parasitic capacitances and self-inductances is counteracted.

According to the invention, the method mentioned in the opening paragraph is for this purpose characterized in that the passive element, the pattern of conductors, and the semiconductor element are formed at a first side of a wafer of semiconductor material, whereupon said wafer is glued with this first side to the substrate and the semiconductor material of the wafer is removed from the second side, except at the area of the semiconductor element.

The passive element, pattern of conductors, and semiconductor element are formed at one side of a wafer of semiconductor material. The conductors provided on the wafer form not only connections within the semiconductor element, but also connections between the semiconductor element and the passive element. The connections between the semiconductor element and the passive element can be realized in the same process steps as the connections within the semiconductor element. Additional process steps are not necessary for this. The connections can be very short and can lie on the wafer surface. In addition, the semiconductor material next to the semiconductor element is removed. Any parasitic capacitances and self-inductances still occurring are thus extremely small. The semiconductor material remaining at the area of the semiconductor element after the removal of semiconductor material constitutes the small slice in which the semiconductor element is formed. The substrate on which the wafer is glued gives the hybrid integrated circuit extra strength.

Preferably, the wafer is provided with an etching mask at its second side at the area of the semiconductor element before the semiconductor material is removed, and the semiconductor material is subsequently removed by etching. The semiconductor material can thus be removed in a simple manner without damage to the semiconductor element. Since etching processes proceed slowly, the removal of the semiconductor material can be speeded up in that the semiconductor material is removed from the second side of the wafer over part of its thickness before the etching mask is provided. This is preferably done by means of a polishing treatment.

BRIEF DESCRIPTION OF THE DRAWING

The invention will be explained in more detail below by way of example with reference to a drawing, in which.

DESCRIPTION OF THE PREFERRED EMBODIMENTS

Figure 1:
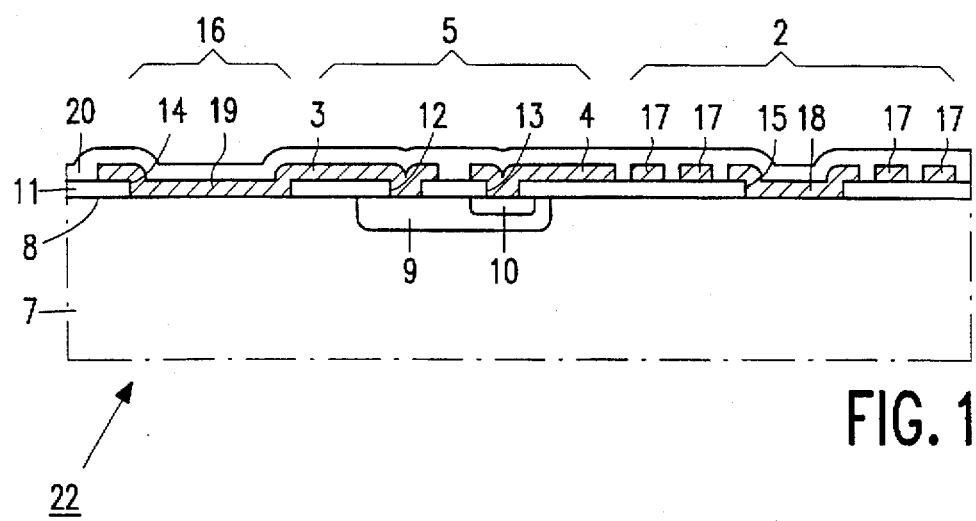
FIGS. 1 to 3 diagrammatically and in cross-section show several stages in the manufacture of a semiconductor device by the method according to the invention.
Figure 2:
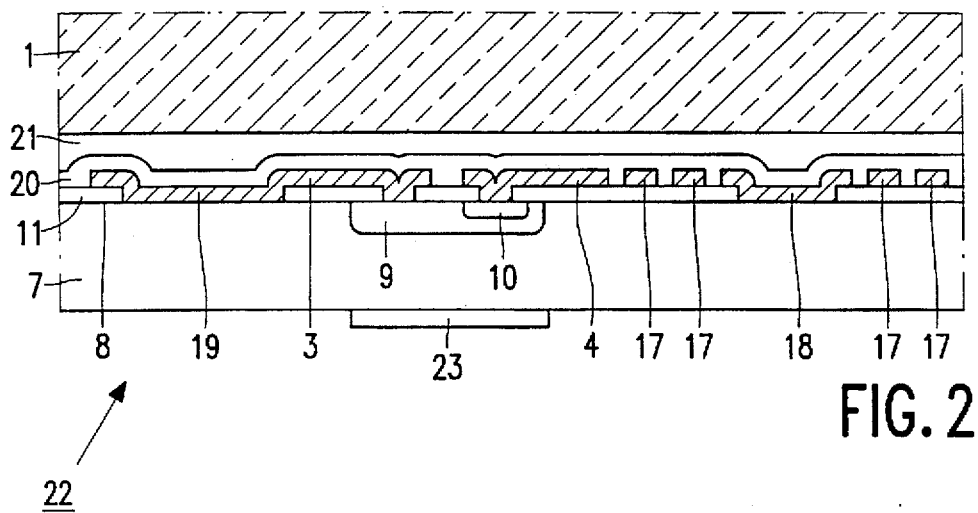
Figure 3:
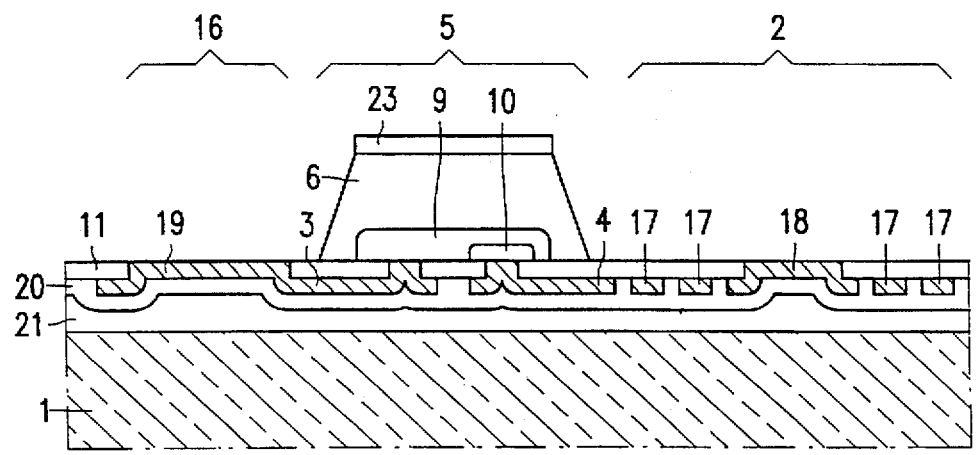

FIGS. 1 to 3 diagrammatically and in cross-section show several stages in the manufacture of a semiconductor device as shown in FIG. 3, with a substrate 1 which is provided with a passive element 2, a coil in this example, a pattern of conductors 3, 4, and a semiconductor element 5 which is formed in a small slice of semiconductor material 6.

Manufacture starts with an n-type silicon slice 7 shown in FIG. 1. A semiconductor element 5 is formed at the first side 8 of the wafer 7 in a usual manner, in this example a bipolar transistor With a p-type base zone 9 and an n-type emitter zone 10. The collector zone of the transistor is formed by the portion of the silicon wafer 7 situated below the base zone 9 and is contacted in a usual manner outside the plane of drawing.

After the semiconductor element has been formed, an approximately 0.5 μm thick silicon oxide layer 11 is provided on the first side 8 of the wafer 7, and windows 12, 13, 14, 15 are subsequently etched therein. Then an aluminum layer is deposited on the insulating layer 11 and in the windows 12, 13, 14, 15, and a pattern of conductors 3, 4 is etched into said aluminum layer in a usual manner. A coil 2 and a connection conductor 16 for the hybrid integrated circuit are formed in the same aluminum layer in which the conductors 3 and 4 are formed. The coil comprises turns 17 and an end 18 which lies on the silicon wafer 7 within the window 15. The connection conductor 16 comprises a conductive portion 19 which lies on the silicon wafer 7 within the window 14. The turns 17 of the coil 2 are connected to the emitter zone 10 of the transistor 5 via the conductor 4. The connection conductor 16 is connected to the base zone 9 of the transistor 5 via the conductor 3.

After the passive element 2, the pattern of conductors 3 and 4, the semiconductor element 5, and the connection conductor 16 have been formed at the first side 8 of the wafer of semiconductor material 17, a layer of passivating material 20 is deposited, whereupon the wafer 7 is fastened with its first side 8 to a substrate 1, for example made of glass or alumina, by means of a layer of glue, for example an epoxy or acrylate glue. Then the semiconductor material of the wafer 7 is removed from the second side 22, except at the area of the semiconductor element 5. Thus only the small slice 6 remains of the wafer of semiconductor material 7 at the area of the semiconductor element 5. After the removal of the semiconductor material, the substrate 1 gives strength to the entire assembly.

Only a single semiconductor element 5 in the form of a transistor formed in the wafer of semiconductor material 7 was formed in the above example so as to keep the drawing simple. In practical hybrid integrated circuits, an integrated circuit comprising a very large number of transistors will actually be combined with a comparatively small number of passive elements such as resistors, capacitors, and coils. The conductors present on the substrate 1 connect the semiconductor elements in the integrated circuit both to one another and to the passive elements. The latter connections can be realized in the same process steps as the former. Additional process steps are not necessary for this. The connections can be extremely short. Since the semiconductor material is removed next to the semiconductor element 5, moreover, any parasitic capacitances and self-inductances still occurring are extremely small.

Before the semiconductor material is removed, the wafer 7 is provided with an etching mask 23 at its second side 22 at the area of the semiconductor element 5, whereupon the semiconductor material is removed through etching. This mask 23 is formed in a layer of silicon nitride in the present example, and the silicon is etched away from the wafer in a KOH solution down to the silicon oxide layer 11. Etching then stops automatically at the silicon oxide. A thin layer of silicon nitride (not drawn) may be provided in the windows 14 and 15 below the aluminum layer in order to protect the aluminum of the end 18 of the coil 2 and the conductive portion 19 of the connection conductor 16 during etching. This silicon nitride layer should obviously be removed again after the removal of the semiconductor material so as to expose the end 18 of the coil 2 and the connection conductor 16.

Since etching processes proceed slowly, the removal of the semiconductor material may be accelerated in that the semiconductor material of the wafer 7 is removed from the second side 22 over part of its thickness before the etching mask 23 is provided, as drawn in FIG. 2. This is preferably done in a polishing treatment.

The coil 2 formed on the wafer lies next to the semiconductor element 5. The semiconductor material of the wafer 7 has been removed at the area of the coil, which thus lies fully insulated on the insulating substrate 1. The coil 2 as a result has a comparatively high quality factor. If the semiconductor material had not been removed at the area of the coil, the quality factor would be much lower.

The conductive portion 19 of the connection conductor 16 and the end 18 of the coil 2 formed at the first side 8 of the wafer 7 are automatically exposed when the semiconductor material is removed. The hybrid integrated circuit may thus be externally contacted after that without special measures.

What is claimed is:

1. A method of manufacturing a semiconductor device with a substrate provided with a passive element, a pattern of conductors, and a semiconductor element which is formed in a small slice of semiconductor material, characterized in that the passive element, the pattern of conductors, and the semiconductor element are formed at a first side of a wafer of semiconductor material, whereupon said wafer is glued with this first side to the substrate and the semiconductor material of the wafer is removed from the second side, except at the area of the semiconductor element.

2. A method as claimed in claim 1, characterized in that the wafer is provided with an etching mask at its second side at the area of the semiconductor element before the semiconductor material is removed, and the semiconductor material is subsequently removed by etching.

3. A method as claimed in claim 2, characterized in that the semiconductor material of the wafer is removed from the second side over part of its thickness before the etching mask is provided.

4. A method as claimed in claim 3, characterized in that the semiconductor material of the wafer is removed from the second side over part of its thickness by means of a polishing treatment.

5. A method as claimed in claim 1, characterized in that a coil is formed as the passive element, situated next to the semiconductor element on the first side of the wafer.

6. A method as claimed in claim 1, characterized in that a connection electrode is formed at the first side of the wafer, which electrode is exposed upon the removal of semiconductor material from the second side.

* * * * *